(12) United States Patent
Johnson (10) Patent No.: US 6,854,657 B2
(45) Date of Patent: Feb. 15, 2005

(54) DUAL BATTERY CONFIGURATION AND METHOD OF USING THE SAME TO PROVIDE A LONG-TERM POWER SOLUTION IN A PROGRAMMABLE SMART CARD

(75) Inventor: Michael W Johnson, Escondido, CA (US)

(73) Assignee: General Instrument Corporation, Horsham, PA (US)

( * ) Notice: Subject to any disclaimer, the term of this patent is extended or adjusted under 35 U.S.C. 154(b) by 59 days.

(21) Appl. No.: 09/997,122

(22) Filed: Nov. 28, 2001

(65) Prior Publication Data

US 2003/0098355 A1 May 29, 2003

(51) Int. Cl.[7] .............................................. G06K 19/06
(52) U.S. Cl. ...................................................... 235/492
(58) Field of Search ................................ 235/492, 441, 235/451, 380, 487, 382; 361/737; 365/226–229; 307/65, 66, 64, 87; 320/116, 118; 455/41, 343

(56) References Cited

U.S. PATENT DOCUMENTS

| | | | | |
|---|---|---|---|---|
| 5,545,935 A | * | 8/1996 | Stewart | 307/150 |
| 5,547,775 A | * | 8/1996 | Eguchi et al. | 320/118 |
| 5,589,719 A | * | 12/1996 | Fiset | 307/131 |
| 5,650,974 A | * | 7/1997 | Yoshimura | 365/229 |
| 5,687,129 A | | 11/1997 | Kim | |
| 5,761,061 A | * | 6/1998 | Amano | 700/82 |
| 5,818,030 A | * | 10/1998 | Reyes | 235/492 |
| 5,841,119 A | * | 11/1998 | Rouyrre et al. | 320/118 |
| 5,867,007 A | * | 2/1999 | Kim | 307/66 |
| 5,955,867 A | * | 9/1999 | Cummings et al. | 320/107 |
| 6,060,789 A | * | 5/2000 | Yamaguchi | 455/41 |
| 6,109,530 A | * | 8/2000 | Larson et al. | 235/492 |
| 6,220,516 B1 | * | 4/2001 | Tuttle et al. | 235/492 |
| 6,239,578 B1 | * | 5/2001 | Schnell et al. | 320/119 |
| 6,273,339 B1 | | 8/2001 | Tuttle et al. | |
| 6,282,407 B1 | * | 8/2001 | Vega et al. | 455/41 |
| 6,325,294 B2 | * | 12/2001 | Tuttle et al. | 235/492 |
| 6,415,982 B2 | * | 7/2002 | Bridgelall et al. | 235/472.01 |
| 6,565,232 B1 | * | 5/2003 | Goldstein et al. | 362/253 |
| 2002/0154137 A1 | * | 10/2002 | Ben-David | 345/596 |
| 2004/0031856 A1 | * | 2/2004 | Atsmon et al. | 235/492 |

FOREIGN PATENT DOCUMENTS

| | | | | |
|---|---|---|---|---|
| DE | 3416780 A1 | | 7/1985 | |
| JP | 361160185 | * | 7/1986 | 235/487 |
| JP | 406124370 | * | 10/1992 | 235/492 |

* cited by examiner

*Primary Examiner*—Thien M. Le
*Assistant Examiner*—Edwyn Labaze
(74) *Attorney, Agent, or Firm*—Steven L. Nichols; Ronald P. Kananen; Rader, Fishman & Grauer PLLC (57) ABSTRACT

A smart card package includes two on-board batteries for providing uninterrupted power to a programmed, volatile memory unit. The first battery is a non-rechargeable battery with sufficient capacity to provide power to the volatile on-board memory during an initial storage period between programming the memory and deployment of the smart card. This initial storage period may be, for example, approximately two years. The second battery is a rechargeable battery that will be charged by the host device in which the smart card is deployed. The second, rechargeable battery can provide power to the volatile memory throughout the life of the card, after the first, non-rechargeable battery is dead. Specifically, the second, rechargeable battery can provide power to the non-volatile memory when needed during, for example, any subsequent storage period or during movement of the smart card between host devices.

22 Claims, 4 Drawing Sheets

DUAL BATTERY CONFIGURATION AND METHOD OF USING THE SAME TO PROVIDE A LONG-TERM POWER SOLUTION IN A PROGRAMMABLE SMART CARD

FIELD OF THE INVENTION

The present invention relates to the field of programmable smart cards. More specifically, the present invention relates to the field of providing power for maintaining programming in the memory of a programmable smart card. A preferred application for the present invention is to provide, through a programmable smart card, controlled access to a cable television network and the services provided thereon.

BACKGROUND OF THE INVENTION

Smart cards are small electronic devices that resemble a credit card in size but contain an embedded microprocessor to store and process information. The class of devices known as "smart cards" includes smart cards, PCMCIA cards (or PC cards) and POD modules. PCMCIA stands for Personal Computer Memory Card International Association, a California nonprofit trade association created to standardize the connection of peripherals to portable computers. POD stands for "Point of Deployment" and refers to modules that are installed in electronic devices at the point of deployment to augment the functionality of the deployed device. As used herein, and in the appended claims, the term "smart card" will be used to refer collectively to smart cards, PCMCIA cards, PC cards, POD modules and any similar device that provides processing functionality provided in a card or card-like package.

Smart cards can be used for a wide variety of purposes. Some smart cards are used as intelligent credit or debit cards. PCMCIA or PC cards provide a lightweight, removable module that can be connected to a desktop computer, laptop computer, personal digital assistant or palm-top computer or other computerized device to provide additional programming and functionality for that computer or device.

An application of smart cards or POD modules that is of particular interest is the use of smart cards to control subscriber access to the services and programming provided over a cable television network.

Cable television systems allow subscribers access to dozens or even hundreds of channels of television programming. This wide variety of programming accounts for the great popularity of cable television. Additionally, the current trend is for cable television systems to provide additional services such as premium channels, pay-per-view programming, video-on-demand programming, Internet access and basic telephony.

In advanced cable television systems, each subscriber is typically provided with a set-top terminal. The set-top terminal is a box of electronic equipment that is used to connect the subscriber's television, or other electronic equipment, to the cable television system. The set-top terminal processes the signal received from the cable television system to provide the services of the cable system to subscribers.

As the premium services of the cable television system expand, security techniques for those premium services become crucial to ensure that only subscribers who have paid for the premium services have access to them. For example, premium channels, such as some movie channels, are scrambled before transmission to prevent unauthorized reception and viewing of those channels. Subscribers who pay additional fees to receive the premium channel or channels are provided with the means to descramble and view the premium channel or channels.

There are many techniques for controlling the remote descrambling of scrambled television signals. Typically a system subscriber who has paid to receive the scrambled premium channel or channels is provided with a descrambler unit that is connected between the source of the television signal source (e.g., a cable feed or a satellite receiver) and the subscriber's television set. While this descrambler unit may be a self-contained unit, descrambling circuitry is frequently and preferably incorporated into the subscriber's set-top terminal.

Unfortunately, proprietary algorithms used by descrambling circuitry can frequently, with enough effort, be "broken" or duplicated by an unauthorized party. Thereafter, unauthorized means of descrambling the cable system's premium channels might be made available to subscribers. To avoid this, the operator of the cable system may need to periodically change the proprietary algorithm used to scramble and descramble premium channels.

If the subscriber's descrambling circuitry is incorporated in a set-top terminal, the old descrambling circuitry must be removed and new descrambling circuitry inserted. To facilitate this process, removable modules that carry the descrambling circuitry can be provided to plug into a port of the set-top box. These removable modules are typically formed as smart cards or POD modules.

When the descrambling circuitry is to be changed or upgraded, the old module can be pulled from the set-top box, and a new module with the new circuitry or programming is installed in the set-top box. Thus, the set-top box can be upgraded without replacing the entire box. In addition to changing or upgrading the security features of the set-top box, other upgraded services that the box cannot currently provide can be provided on a smart card or POD module and installed to upgrade the set-top box without having to replace it entirely.

Smart cards, like those described above, typically have a programmable circuit that can be programmed with the functionality the card is designed to provide, for example, the proprietary algorithm used by a set-top box for decrypting or descrambling purposes. This programmability makes smart cards very adaptable and useful for a wide variety of purposes.

Smart cards may incorporate firmware programming to perform certain tasks. More sophisticated smart cards incorporate memory devices in which data and/or programming is stored. A programmable circuit in such a smart card may typically include a non-volatile Static Random Access Memory (SRAM) chip in which data or programming can be stored. Alternatively, more complex smart cards require the capacity and features of volatile memory. Volatile memory has advantages over non-volatile memory, but must have a constant source of power to maintain the data or programming stored therein.

Consequently, where volatile memory is used in a smart card, it becomes necessary to provide a power source to maintain the volatile memory. When the card is installed in a computer or computerized device, the volatile memory in the card can draw power from that host device. However, before the card is installed, or if the card is removed and stored, or re-installed in another host device, there may be difficulty in providing power to volatile memory.

To address these problems, it has been known to incorporate a single, small battery in the smart card to provide power to the on-board volatile memory. However, because of obvious size constraints, such battery power is of very limited capacity. This poses serious problems when the card is manufactured, programmed and may then spend as much as two years in storage before deployment in a host device.

Consequently, there is a need in the art for a system and method of providing power to a programming volatile memory on-board a smart card, particularly during an extended storage period between programming and deployment.

SUMMARY OF THE INVENTION

The present invention meets the above-described needs and others. Specifically, the present invention provides a system and method of providing power to a programming volatile memory on-board a smart card, particularly during an extended storage period between programming and deployment.

Additional advantages and novel features of the invention will be set forth in the description which follows or may be learned by those skilled in the art through reading these materials or practicing the invention. The advantages of the invention may be achieved through the means recited in the attached claims.

The present invention may be embodied and described as a smart card including: processing and memory circuitry; a primary battery disposed in the smart card for providing power to the processing and memory circuitry; and a secondary battery disposed in the smart card for providing power to the processing and memory circuitry. Preferably, the primary battery is non-rechargeable. The primary battery may be a lithium battery.

The processing and memory circuitry includes an interface for electrically connecting the smart card to a host device. The interface includes a power line for receiving power from the host device. The secondary battery is a rechargeable battery, and the smart card includes recharging circuitry for recharging the secondary battery with power from the host device.

A preferred application of the smart card of the present invention involves access control data for a cable television system stored in the processing and memory circuitry.

The present invention also encompasses the methods of making and using the smart card and on-card power system described above. For example, the present invention includes method of providing power to processing and memory circuitry of a smart card by providing power to the processing and memory circuitry with a primary non-rechargeable battery disposed in the smart card; and providing a secondary rechargeable battery disposed in the smart card that is charged when the smart card is installed in a host device. Power is the provided to the processing and memory circuitry with the secondary battery when the smart card is removed from the host device.

The method may also include charging the secondary battery prior to installation of the smart card in a host device; and powering the processing and memory circuitry with the secondary battery after depletion of the primary battery. In this way, the initial shelf life of the card prior to installation in a host device is maximized.

BRIEF DESCRIPTION OF THE DRAWINGS

The accompanying drawings illustrate preferred embodiments of the present invention and are a part of the specification. Together with the following description, the drawings demonstrate and explain the principles of the present invention.

Throughout the drawings, identical elements are designated by identical reference numbers.

DETAILED DESCRIPTION OF THE PREFERRED EMBODIMENTS

The present invention may be embodied as a smart card with two on-board batteries for providing uninterrupted power to a programmed, volatile memory unit. The first battery is preferably a non-rechargeable battery with sufficient capacity to provide power to the volatile on-board memory during an initial storage period between programming the memory and deployment of the smart card. This initial storage period may be, for example, approximately two years. The second battery is a rechargeable battery that will be charged by the host device in which the smart card is deployed. The second, rechargeable battery can provide power to the volatile memory throughout the life of the card, after the first, non-rechargeable battery is dead. Specifically, the second, rechargeable battery can provide power to the non-volatile memory when needed during, for example, any subsequent storage period or during movement of the smart card between host devices.

Figure 1:
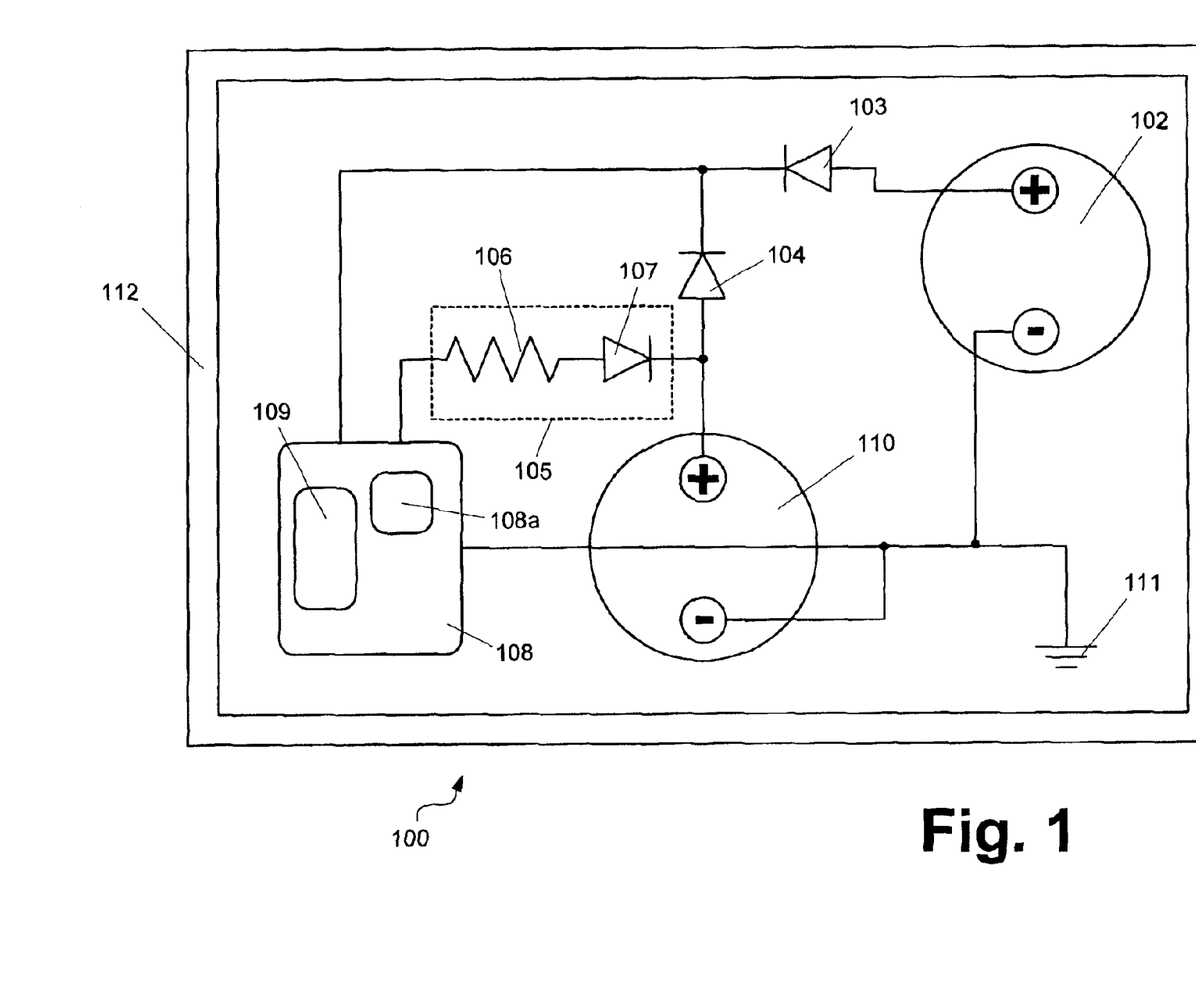
FIG. 1 is a circuit diagram of a smart card and on-board power system according to the present invention.

Using the drawings, the preferred embodiments of the present invention will now be explained. FIG. 1 illustrates a circuit diagram of a preferred embodiment of a smart card with a two-battery power system according to the present invention.

As shown in FIG. 1, a smart card (100) according to the present invention provides processing and memory circuitry (108) in a card-shaped package (112). The processing and memory circuit (108) will preferably include a volatile memory unit (108a). The card (100) may be a smart card, a PCMCIA card, a PC card or a POD module. The card (100) may be the approximate size and shape of a credit card, or may be larger or smaller depending on the needs of the particular application to which it is put. The processing and memory circuitry (108) are typically disposed in a cavity within the card packaging (112).

The processing and memory circuit (108) also comprises an electrical interface (109) with which the processing and memory circuit (108) communicates with the host device in which it is eventually installed. This interface (109) may have, for example, electrical pins, contact pads or a contract strip for creating the electrical contact with the host device. The interface (109) may also include optical data transmission capability. Preferably, the interface (109) also includes a power coupling so that the smart card can draw power from the host device in which it is installed.

Under the principles of the present invention, the smart card (100) also includes two batteries, a primary or sacrificial battery (102) and a secondary, rechargeable battery (110). The primary battery (102) is preferably non-rechargeable and provides the capacity to power the processing and memory circuit (108), particularly the volatile memory unit (108a), during an initial storage period between the manufacturing and programming of the card (100) and eventual deployment of card (100). As noted above, this initial storage period can be as much as two years or more.

Preferably, the primary, sacrificial battery (102) is a lithium battery, particularly, a thin packaged coin cell battery. While other battery chemistries can be used, lithium batteries provide relatively large power capacities, but also have a long storage life under even the harshest conditions, i.e., high temperature. Thus, the primary battery (102) can readily provide the necessary power for the memory unit (108a) during the lengthy initial storage period. At present, lithium batteries provide the best available combination of power capacity and useful life. However, emerging battery chemistries may improve over lithium batteries in these characteristics that are important to the principles of the present invention. Any battery can be used as the sacrificial battery under the principles of the present invention. However, the invention prefers a battery with sufficient power capacity over the longest possible storage life.

Another important consideration in selecting a battery size and chemistry for use in the present invention is the voltage requirements of the on-card processing and memory circuit (108). As voltage requirements in such small, silicon-based circuits decrease; the output voltage of the battery used must decrease or be limited accordingly.

As shown in FIG. 1, the primary battery (102) is connected in a circuit with the processing and memory circuit (108). This circuit preferably includes a ground (111) connected to the negative terminal of the primary battery (102).

The primary battery (102) discharges power to the processing and memory circuit (108) through a diode (103). This diode (103) prevents any power in the secondary, rechargeable battery (110) from discharging into the primary battery (102). This is particularly important after the primary battery (102) is dead and the secondary battery (110) is the sole backup power source for the processing and memory circuit (108).

The secondary battery (110) is also connected in a circuit with the processing and memory circuit (108). The secondary battery (110) discharges power to the processing and memory circuit (108) through a diode (104). The diode (104) is important to prevent the primary battery (102) from attempting to discharge into and charge the secondary battery (110). The negative terminal of the secondary battery (110) is also connected to the ground (111).

A recharging circuit (105) is also preferably provided on-board the card (100) to recharge the secondary battery (110). As shown in FIG. 1, power received from the host device (not shown) through the interface (109) can be fed to the secondary battery (110) through a resistor (106) and a diode (107). The diode (107) prevents discharge of the secondary battery (110) back into the power line from the interface (109).

Consequently, the secondary battery (110) can be recharged during times when the card (100) is installed in a host device. The secondary battery (110) then provides power for the processing and memory circuit (108) throughout the life of the card during times when the card is removed from the host device and temporarily stored or moved to another host device.

Because both the primary and secondary batteries of the present invention are incorporated into the card package (112), there are no constraints or unique requirements imposed on storage facilities, middle-market vendors or end users.

Figure 2:
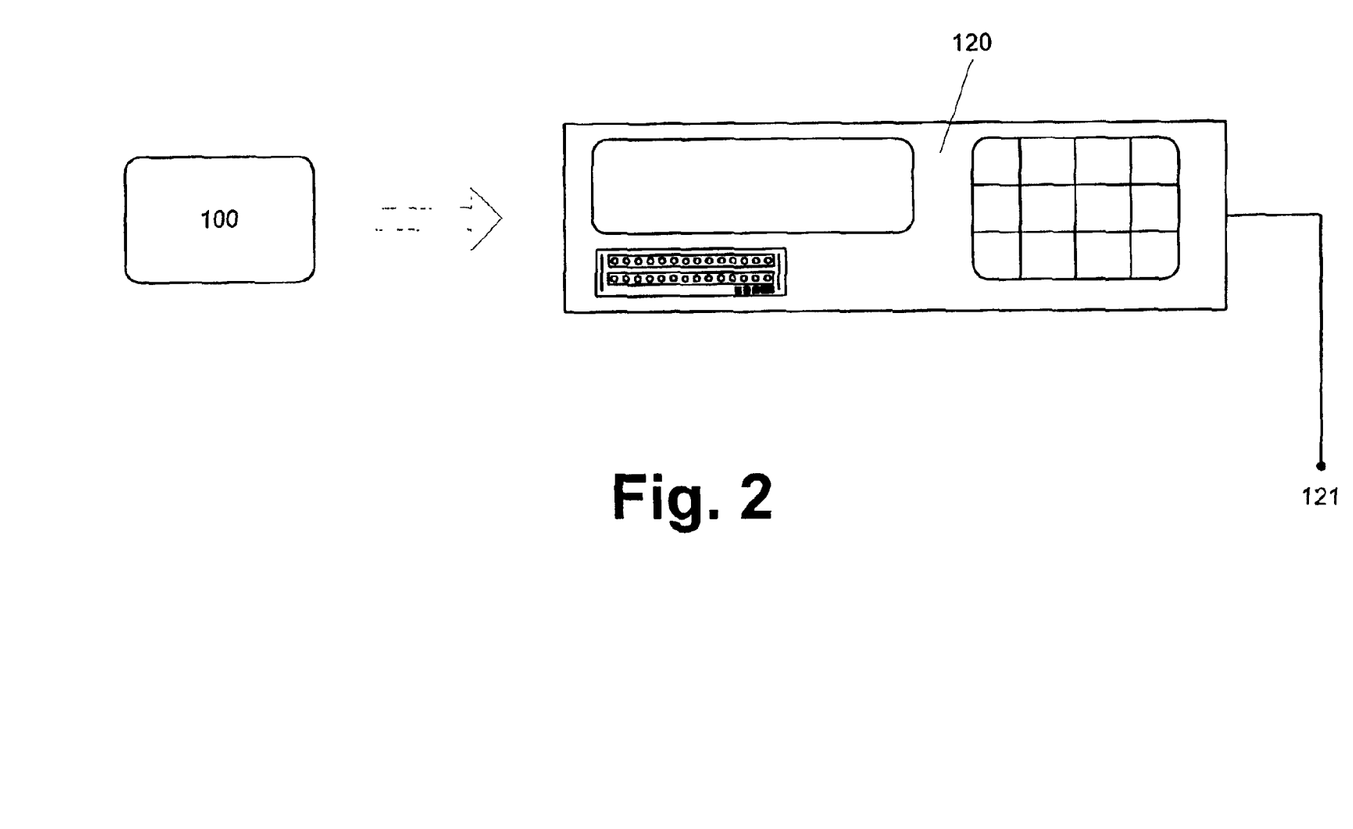
FIG. 2 is an illustration of a particular application of the smart card of the present invention used for access control in set-top box.

FIG. 2 illustrated a preferred application of the smart card (100) of the present invention. As shown in FIG. 2, and as described above, the smart card (100) with the full-life power system of the present invention can be advantageously used to control access to the services available over a cable television network. This is accomplished by programming the card (100) with control access data, e.g. decryption algorithms, authorization codes, etc. This data is protected in the memory of the card (100) by the dual battery system described above in connection with FIG. 1.

The card (100) is then installed in a set-top terminal (120) that is connected (121) to a cable television system. With the control access data on the card (100), the set-top terminal's access to the services provided over the cable television system will be enabled or enhanced. Thus, access to those services can be controlled by controlled distribution of the card (100).

Figure 3:
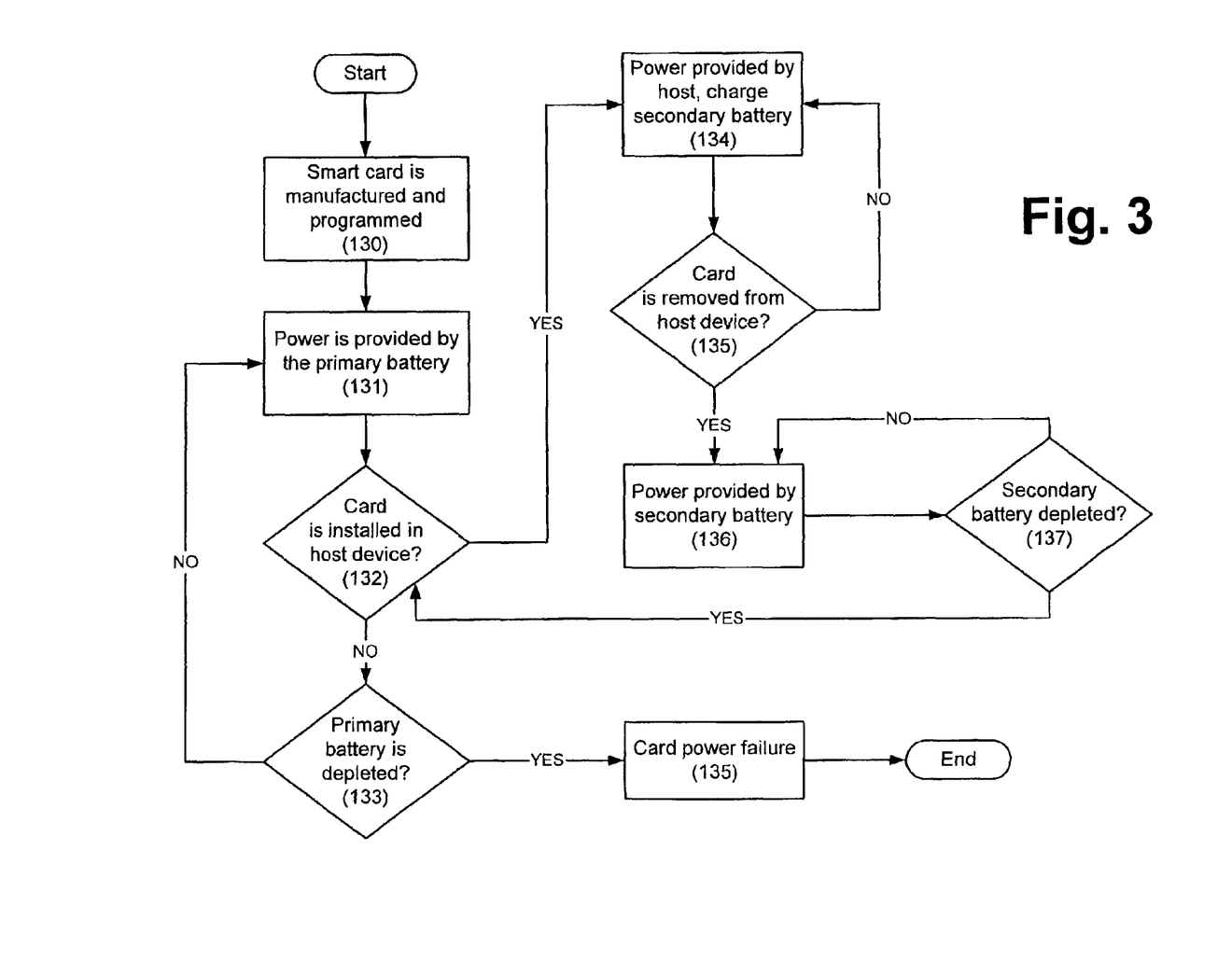
FIG. 3 is a flowchart of a first preferred method of powering a smart card according to the present invention.

FIG. 3 is a flow chart illustrating the method of providing power on-board a smart card according to the present invention. As shown in FIG. 3, the process starts when the smart card is manufactured and programmed (130). At this point, power for the card's circuitry, particularly the volatile memory circuitry, is provided by the non-rechargeable primary battery (131).

If the card is not installed in a host device before the primary battery is depleted (133), the card will experience power failure (135). However, as long as the primary battery is not depleted, power is provided (131). As noted above, this initial shelf life of the card can be as much as two years or more. Thus, the primary battery should be designed to power the card over at least that period of time.

When the card is installed in a host device (132), power is provided by the host device and the secondary, rechargeable battery is charged (134). If the card is then removed from the host device (135), the secondary battery provides power (136). If the secondary battery becomes depleted (137) and the card has not be re-installed in a host device (132), and power remaining in the primary battery can be drawn (133). However, if the primary battery is depleted, power failure results (135).

This dual battery combination, according to the present invention, consistently provides power for the card over its useable life, particularly during the initial storage period before the card is first deployed. However, according to another embodiment of the present invention, this initial shelf life of the card can be extended even beyond the life of the primary battery.

Figure 4:
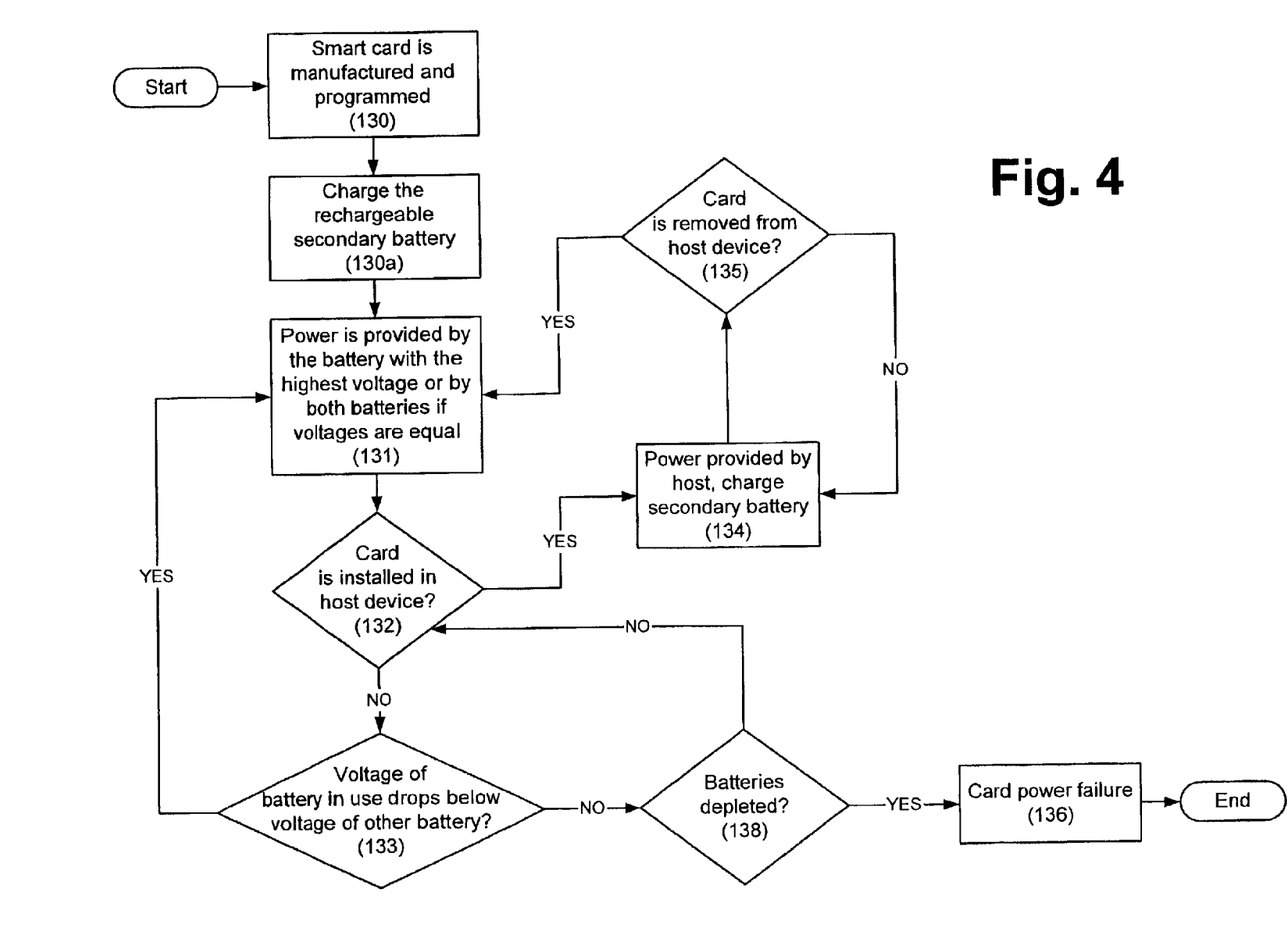
FIG. 4 is a flowchart of a second preferred method of powering a smart card according to the present invention.

FIG. 4 illustrates an alternative embodiment of the present invention in which the shelf life of the card is extended beyond the life of the primary battery. As shown in FIG. 4, the smart card is manufactured and programmed (130). Additionally, the secondary battery is charged (130a).

The card is then placed in initial storage until first deployment. During this period, power is provided by either the primary or secondary battery (131). Whichever battery has the highest voltage will provide power to the memory. If the card is installed in a host device before the batteries are depleted (132), power is provided by the host (134), the secondary battery can charge (134) and the scenario proceeds as described above in connection with FIG. 3.

However, before the card is installed in a host device, the primary battery and the secondary battery, which was charged during manufacture, will discharged to continue providing power to the card-. As noted above, the system will draw power from whichever battery has the higher voltage (131). If the batteries have equal voltages, both will actively provide power to the card (131).

For example, the primary battery, particularly if it is a lithium battery, will hold a nominal voltage throughout its useful life. In contrast, the secondary rechargeable battery will slowly lose voltage as its charge is depleted. If the voltage provided by the batteries equalizes, both will be utilized to provide power. If the voltage provided by either battery drops below the voltage of the other battery, the battery providing the power to the card will be switched (133). In other words, the secondary battery may initially have a higher voltage than the primary battery and may, therefore, be used to power the card. As the secondary battery discharges, its voltage will eventually equal that of the primary battery. Then both will be used to power the card. Eventually, the voltage of the secondary battery will drop below that of the primary battery (133). At that point, power will be drawn for the card from the primary battery (131). This continues until such time as the primary battery becomes so depleted that its voltage equals or drops below that of the secondary battery. At that point, the secondary battery is re-engaged to power the card.

This process continues until the batteries are both depleted (138) or the card is installed in a host device (132). If both the batteries become depleted (138) before the card is installed in a host device, power failure results (136). However, as shown in FIG. 4, the present invention can be advantageously utilized to provide an initial shelf life for a smart card that is equivalent to the lives of both the primary and secondary batteries on-board the card.

If the card is removed from the host (135), the draining of the two batteries is reinitiated (131) to maintain memory.

The preceding description has been presented only to illustrate and describe the invention. It is not intended to be exhaustive or to limit the invention to any precise form disclosed. Many modifications and variations are possible in light of the above teaching.

For example, it may be possible to provide both the non-rechargeable, sacrificial battery unit and the rechargeable battery unit of the present invention in a single battery package or unit. In such an integrated unit, an internal diode or similar device preventing discharge of the rechargeable unit into the non-rechargeable unit would be required.

Additionally, flexible batteries, which are being developed, may be useful in smart cards that require or are advantaged by flexibility.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A smart card comprising:
   processing and memory circuitry;
   an interface for electrically connecting said smart card to a host device, said interface comprising a power line for receiving power from said host device;
   a primary battery disposed in said smart card for providing power to said processing and memory circuitry; and
   a secondary rechargeable battery disposed in said smart card for providing power to said processing and memory circuitry;
   recharging circuitry for recharging said secondary battery with power from said host device; and
   means for preventing said primary and secondary batteries from charging each other including a first diode preventing discharge of said secondary battery into said primary battery and a second diode preventing discharge of said primary battery into said secondary battery.

2. The smart card of claim 1, wherein said primary battery is non-rechargeable.

3. The smart card of claim 2, wherein said primary battery is a lithium battery.

4. The smart card of claim 1, further comprising access control data for a cable television system stored in said processing and memory circuitry.

5. A method of providing power to processing and memory circuitry of a smart card said method comprising:
   providing a charged primary battery and a charged secondary battery in said smart card prior to initial installation of said smart card in a host device;
   determining whether said primary or secondary battery has a higher voltage prior to initial installation of said smart card in said host device; and
   providing power to said processing and memory circuitry with whichever battery has said higher voltage prior to initial installation of said smart card in said host device.

6. The method of claim 5, wherein said primary battery is a lithium battery.

7. The method of claim 5, further comprising:
   installing said smart card in a host device;
   electrically connecting said smart card to said host device and providing power to said smart card from said host device; and
   charging said secondary battery with power from said host device.

8. The method of claim 7, further comprising providing power to said processing and memory circuitry with said secondary battery when said smart card is removed from said host device.

9. The method of claim 7, further comprising:
   charging said secondary battery prior to installation of said smart card in a host device; and
   powering said processing and memory circuitry with said secondary battery after depletion of said primary battery.

10. The method of claim 7, further comprising preventing discharge of said secondary battery into said primary battery.

11. The method of claim 7, further comprising preventing discharge of said primary battery into said secondary battery.

12. The method of claim 7, further comprising storing access control data for a cable television system in said processing and memory circuitry of said smart card.

13. The method of claim 5, further comprising charging said secondary rechargeable battery with power from said host device when said smart card is installed in said host device.

14. The method of claim 5, wherein said primary battery is non-rechargeable.

15. The method of claim 5, further comprising periodically determining whether said primary or secondary battery has a higher voltage prior to installation of said smart card in said host device; and providing power to said processing and memory circuitry with whichever battery has said higher voltage prior to installation of said smart card in said host device.

16. The method of claim 5, further comprising switching which of the two said batteries provides power to said processing and memory circuitry when a voltage of the battery supplying power drops below a voltage of the battery not supplying power.

17. The method of claim 5, further comprising, if said primary and secondary batteries have an equal voltage, supplying power to said processing and memory circuitry with both said primary and secondary batteries.

18. A method of providing power to processing and memory circuitry of a smart card said method comprising:

providing power to said processing and memory circuitry with a primary non-rechargeable battery disposed in said smart card prior to installation of said smart card in a host device;

charging a secondary battery prior to initial installation of said smart card in a host device; and powering said processing and memory circuitry with said secondary battery prior to initial installation of said smart card in a host device.

19. The method of claim 18, wherein said primary battery is a lithium battery.

20. The method of claim 18, further comprising:

charging said secondary rechargeable battery with power from said host device when said smart card is installed in said host device; and providing power to said processing and memory circuitry with said secondary battery when said primary battery is depleted and said smart card is removed from said host device.

21. The method of claim 18, further comprising:

preventing discharge of said secondary battery into said primary battery; and preventing discharge of said primary battery into said secondary battery.

22. The method of claim 18, further comprising storing access control data for a cable television system in said processing and memory circuitry of said smart card.

* * * * *

UNITED STATES PATENT AND TRADEMARK OFFICE
CERTIFICATE OF CORRECTION

PATENT NO. : 6,854,657 B2
APPLICATION NO. : 09/997122
DATED : February 15, 2005
INVENTOR(S) : Michael W. Johnson Page 1 of 1

It is certified that error appears in the above-identified patent and that said Letters Patent is hereby corrected as shown below:

Column 8, Line 39, Claim 9, change "The method of claim 7, further..." to --The method of claim 5, further...--.

Column 8, Line 45, Claim 10, change "The method of claim 7, further..." to --The method of claim 5, further...--.

Column 8, Line 47, Claim 11, change "The method of claim 7, further..." to --The method of claim 5, further...--.

Column 8, Line 49, Claim 12, change "The method of claim 7, further..." to --The method of claim 5, further...--.

Signed and Sealed this

Twentieth Day of March, 2007

JON W. DUDAS
*Director of the United States Patent and Trademark Office*